United States Patent [19]
Tarczy-Hornoch

[11] 3,942,124
[45] Mar. 2, 1976

[54] PULSE SYNCHRONIZING APPARATUS AND METHOD

[76] Inventor: Zoltan Tarczy-Hornoch, 7106 Marlborough Terrace, Berkeley, Calif. 94705

[22] Filed: Dec. 26, 1973

[21] Appl. No.: 427,459

[52] U.S. Cl. .................. 328/63; 307/208; 307/269
[51] Int. Cl.² .................. H03K 1/17; H03K 5/13
[58] Field of Search .......... 328/37, 63, 72; 307/208, 307/221 R, 269

[56] References Cited
UNITED STATES PATENTS

| | | | |
|---|---|---|---|
| 3,422,425 | 1/1969 | Vallee | 328/63 |
| 3,471,790 | 10/1969 | Kaps | 328/63 |
| 3,593,162 | 7/1971 | Patmore | 328/37 |
| 3,614,632 | 10/1971 | Leibowitz et al. | 328/37 |
| 3,730,994 | 5/1973 | Terry et al. | 328/63 |

OTHER PUBLICATIONS

"Remote Loop Attachment" by Betts et al., IBM Tech. Discl. Bull. Vol. 13, No. 7, Dec. 1970, pp. 2090–2091.

*Primary Examiner*—Stanley D. Miller, Jr.

[57] ABSTRACT

Apparatus and method is provided to synchronize randomly occuring pulses to the nearest one of a train of clock-pulses. Logic circuitry is provided to shift the synchronization of a pulse from the nearest clock to one clock-pulse earlier or later if said pulse is closely followed or preceded by one or more other pulses to be synchronized, and optimum synchronization of all pulses as a group requires the synchronization of said pulse earlier or later respectively.

7 Claims, 2 Drawing Figures

PULSE SYNCHRONIZING APPARATUS AND METHOD

BACKGROUND OF THE INVENTION

There is frequently a need to synchronize or reclock randomly occuring input pulses, for example to quantize radar return pulses for subsequent computer processing. The shortcoming of conventional synchronizers is, that when the leading edge of an input pulse is located in a time interval centered so that there is an equal probability of synchronization with an earlier or later clock pulse, the circuit may output two pulses, one or two partial (less than full amplitude, thus error inviting) pulses or none at all. The centered time interval will be called the ambiguity interval.

Also conventional synchronizers will lose one pulse, if the leading edges are separated by less than a full clock period. Therefore there is a need for an improved pulse synchronizing apparatus and method, which will correctly synchronize input pulses to clock pulses without losing or gaining pulses, even if input pulses are closer than clock period apart.

SUMMARY OF THE INVENTION AND OBJECTS

The logic circuit consists of commercially available integrated circuit flip-flops (FF) and gates, which normally are not capable to make subnanosecond resolution time decisions, but by the circuitry shown, are able to do so. A two phased clock is utilized in effect by presenting delayed and undelayed input pulses, and therefore each input pulse triggers at least one and at most two FF-s into the set (logic 1) state. Thus any pattern of input pulses will generate a corresponding pattern of set FF-s in the logic circuit. This pattern is moved through two sets of FF-s by the clock like in a two channel shift register. A pair of AND gates monitors the pattern, and in two special cases intercepts and modifies the flow of set states. An output OR gate and a reclocking AND gate complete the circuit and provide correctly synchronized output pulses even for combinations of input pulses a prior art synchronizer would not be able to resolve.

In general, it is an object of the present invention to provide a more accurate pulse synchronizer apparatus and method.

Another object of the invention is a synchronizer which does not lose or gain pulses in the process.

Another object of the invention is a synchronizer which correctly sychronizes groups of pulses.

Another object of the invention is a synchronizer which can correctly resolve pulses even if they are somewhat closer than clock period apart.

Another object of the present invention is to provide a logic circuit with time-hysteresis.

Additional objects and features of the invention will appear from the following description in which the preferred embodiment is set forth in conjunction with the accompanying drawings.

DESCRIPTION OF THE PREFERRED EMBODIMENT

Figures 1, 2:
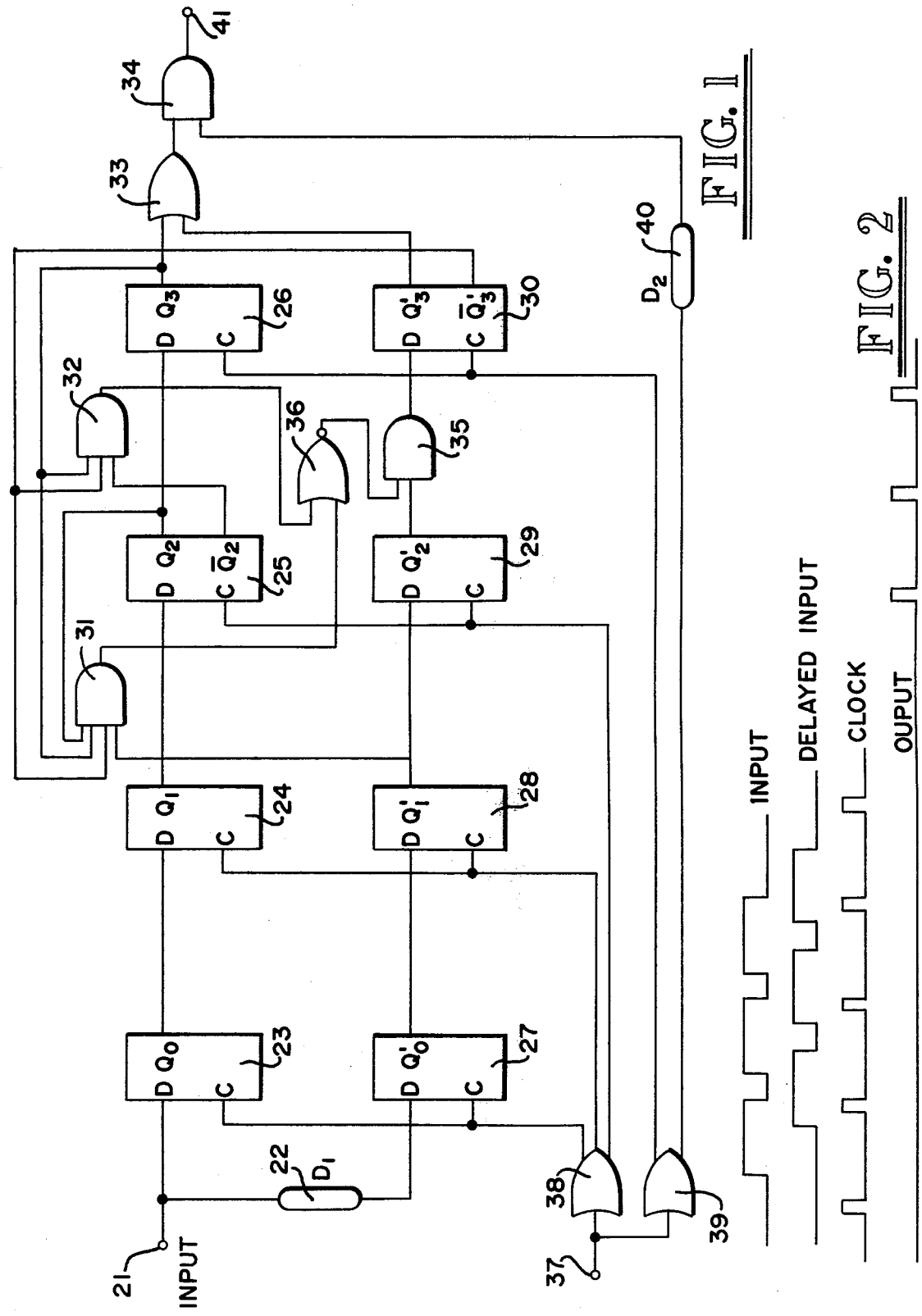
FIG. 1 is a logic diagram of the preferred embodiment of the present invention.
FIG. 2 is a timing diagram showing input, delayed input, clock and output pulses.

On the logic diagram of the preferred embodiment, FIG. 1, the input pulses are fed to terminal 21. Eight type D FF-s 23 to 30 are utilized, for example MC 10231. This component and all subsequently referenced integrated circuit components are manufactured by Motorola Semiconductor Products Inc. P.O. Box 20912 Phoenix, Arizona 85036. JK type FF-s could also be used. The first two FF-s receive the input pulse direct and through a $D_1 = T/2$ long delay element (22) respectively, where T is the clock period, for example 5 nanoseconds. All FF-s receive clock pulses via clock terminal 37 and buffers 38 and 39.

With the pulse relationships shown on FIG. 2 both FF 23 and 27 will be triggered (logic 1) at clock time in response to each input pulse. But slight input pulse advance will cause only 27 to be set, and about T/4 delay will cause only 23 to be triggered. In all phase relationships at least one and at most two of the FF-s will be triggered in response to one input pulse.

FF-s in general have a tendency to teeter for a relatively long time between set and reset conditions if presented with just the worst timing between D and clock inputs. The MC 10231 is no exception, it can make a 0 or 1 decision as late as 25 ns after a marginal trigger. As will be seen later, either triggering or non-triggering is acceptable in the ambiguity interval, but late triggering is not acceptable.

To solve this problem, a multiple reclocking scheme is used much like a shift register. Outputs $Q_0$ and $Q_o'$ are presented to flip-flops 24 and 28 respectively as data, and one clock period later $Q_1$ and $Q_1'$ will repeat the state of $Q_o$ and $Q_o'$, but without ambiguity. It should be noted that the MC 10231 is a master slave flip-flop; therefore, a total of four regenerations occur before $Q_1$ and $Q_1'$ outputs appear. At each regeneration, it becomes less probable that the "teetering" output of one flip-flop is just the marginal "teeter" causing input for the next one. The measured probability of teetering on the MC 10231 is once in a billion after two stages. By the time the process is repeated once more in FF-s 25 and 29, teetering is eliminated beyond measurable limits.

After two stages of reclocking, for each input pulse one or two of the four flip-flops, 25, 26, 29 and 30, will be set to logic 1 state. Table I shows all the possible combinations as patterns named a to g.

It can be seen that if the pattern in Table i is a, b or c after the third clock pulse, d, e and f will be present after the fourth clock pulse. Outputs $Q_3$ and $Q_3'$, OR gated (33) together, AND gated (34) for reclocking, would yield one synchronized output pulse four clocks later for every input pulse; but in case g, it would give two output pulses, one with the third clock and one with the fourth clock.

It is not possible to say, though, that all double output pulse situations are in error and one output has to be eliminated, since subsequent output pulses may correctly reflect two adjacent input pulses. To decide which are legitimate and which are false double pulse indications, it is necessary to look at all possible patterns in the four flip-flops in response to double input pulses. By applying double pulses variable in phase in respect to the clock pulses to a circuit built according to FIG. 1, the patterns named h to o shown in Table II can be verified experimentally. As can be seen, true double pulses are indicated by three or four 1-s or two 1-s separated by a 0. The previously proposed OR gate would correctly provide two subsequent output pulses.

Therefore, only the pattern on line g Table I is troublesome. To avoid the error, gating must be provided to prevent case g from yielding an output pulse with one of the clocks (arbitrarily, the fourth). Stating the logic requirement: there should be no carry pulse from $Q_2'$ to $Q_3'$ on the next clock pulse, if the pattern in the FF-s is $\overline{Q_2}Q_2'\overline{Q_3}\overline{Q_3}' = 1$, therefore $\overline{Q_2}Q_3\overline{Q_3}' = \overline{carry}$. Gates 32, 36 and 35 implement this logic function.

A similar analysis would show, that in case of triple or higher multiple pulses an error could occur, unless the carry pulse is eliminated in case $Q_1'Q_2Q_2'\overline{Q_3}\overline{Q_3}' = 1$, therefore $Q_1'Q_2Q_3\overline{Q_3}' = \overline{carry}$. Gate 31 together with the previous gates 36 and 35 serve to eliminate this problem. The logic can be implemented by other gating.

$D_2$ (40) is a delay element to compensate for propagation delays, and is connected to gate 34, which will reclock the output of gate 33 in order to produce narrow output pulses like the clock pulses.

For the gates commercially available circuits can be used, for example MC 10210 for 38 and 39, MC 10109 for 31 and 32, MC 10104 for 34 and 35, MC 10102 for 33 and 36.

TABLE I

|   | $Q_2$ | $Q_2'$ | $Q_3$ | $Q_3'$ |
|---|---|---|---|---|
| a | 1 | 0 | 0 | 0 |
| b | 0 | 1 | 0 | 0 |
| c | 1 | 1 | 0 | 0 |
| d | 0 | 0 | 1 | 0 |
| e | 0 | 0 | 0 | 1 |
| f | 0 | 0 | 1 | 1 |
| g | 0 | 1 | 1 | 0 |

TABLE II

|   | $Q_2$ | $Q_2'$ | $Q_3$ | $Q_3'$ |
|---|---|---|---|---|
| h | 1 | 0 | 1 | 0 |
| i | 1 | 1 | 1 | 0 |
| j | 1 | 0 | 0 | 1 |
| k | 0 | 1 | 0 | 1 |
| l | 1 | 1 | 0 | 1 |
| m | 1 | 0 | 1 | 1 |
| n | 0 | 1 | 1 | 1 |
| o | 1 | 1 | 1 | 1 |

TABLE III

| $Q_0$ | $Q_0'$ | $Q_1$ | $Q_1'$ | $Q_2$ | $Q_2'$ | $Q_3$ | $Q_3'$ | Output |   |   |   |
|---|---|---|---|---|---|---|---|---|---|---|---|
| 0 | 0 | 0 | 0 | 0 | 0 | 0 | 1 | 0 | 0 | 0 | 1 |
| 0 | 0 | 0 | 0 | 0 | 0 | 1 | 0 | 0 | 0 | 0 | 1 |
| 0 | 0 | 0 | 0 | 0 | 1 | 1 | 0 | 0 | 0 | 0 | 1 |
| 0 | 0 | 0 | 0 | 0 | 1 | 1 | 0 | 0 | 0 | 0 | 1 |
| 0 | 0 | 0 | 0 | 0 | 1 | 1 | 1 | 0 | 0 | 1 | 1 |
| 0 | 0 | 0 | 0 | 1 | 1 | 1 | 0 | 0 | 0 | 1 | 1 |
| 0 | 0 | 0 | 0 | 1 | 1 | 1 | 1 | 0 | 0 | 1 | 1 |
| 0 | 0 | 0 | 1 | 1 | 1 | 1 | 0 | 0 | 0 | 1 | 1 |
| 0 | 0 | 0 | 1 | 1 | 1 | 1 | 1 | 0 | 1 | 1 | 1 |
| 0 | 0 | 1 | 1 | 1 | 1 | 1 | 0 | 0 | 1 | 1 | 1 |
| 0 | 0 | 1 | 1 | 1 | 1 | 1 | 1 | 0 | 1 | 1 | 1 |
| 0 | 1 | 1 | 1 | 1 | 1 | 1 | 0 | 1 | 1 | 1 | 1 |
| 0 | 1 | 1 | 1 | 1 | 1 | 1 | 1 | 1 | 1 | 1 | 1 |
| 1 | 1 | 1 | 1 | 1 | 1 | 1 | 0 | 1 | 1 | 1 | 1 |

Table III shows all important single and multiple pulse patterns in the eight FF-s on the left side and the resulting output sequence starting with the rightmost bit on the right. All other patterns, such as pulses separated by gaps, can be derived from these patterns.

An important property of the circuit on FIG. 1 is, that it exhibits at certain times a two valued output as a function of time. This can be called time-hysteresis, since the output will be a function of the immediately preceding or following events. Specifically line g of Table I would output a 0 1 sequence standing alone, but if followed by another pulse as in i of Table 2, the output becomes 11 instead of 011. This can be verified experimentally. In other words, multiple pulses are considered as a group for determining the optimum timing of synchronization. The time-hysteresis also permits pulses spaced closer than clock period apart to be correctly resolved, since if two pulses compete for the same clock pulse, the one further away from the clock will be synchronized to the next closest clock pulse.

It should be noted, that the circuit uses commercial components to achieve 30 picoseconds time resolution, significantly better than prior art circuits.

It is apparent from the foregoing, that a new and improved pulse synchronizing apparatus and method has been provided. There has been provided a synchronizer which does not lose or gain pulses, even in multiple groups, and which can correctly resolve pulses somewhat closer than clock period apart. It is also apparent that other objects and features of the invention herein before set forth have been met.

I claim:

1. In a method for synchronizing input pulses to a train of clock pulses utilizing n pairs of flip-flops from first to n-th pair, where n is an integer greater than one, and wherein each flip-flop can assume one of the states of set and reset, the first step of applying said clock pulse signals to each of the n pairs of flip-flops and said input pulse signals to the first pair of flip-flops, one of the two signals of input and clock pulses being delayed to one of the flip-flops of the first pair, the second step of applying the outputs of the first pair of flip-flops to the inputs of the second pair of flip-flops, and the third step of repeating this application of outputs to inputs of the following pair until the inputs of the n-th pair are reached, thereby obtaining momentarily in said flip-flop pairs a pattern of set and reset states representing in quantized form the initial time relationship between said input and clock pulse signals.

2. A method as in claim 1 together with the step of utilizing logic gating connected at least to the n-th flip-flop pair to obtain from the flip-flop pairs in synchronism with one of the clock pulses one output pulse for every input pulse.

3. In an apparatus for synchronizing input pulses an input terminal connected to an input of a first flip-flop, a delay element connected between the input terminal and an input of a second flip-flop, said first and second flip-flops forming a first pair of flip-flops, additional pairs of flip-flops up to an n-th pair consisting of odd and even numbered flip-flops with odd and even numbered inputs receiving signals from outputs of preceding odd and even numbered flip-flops respectively, a clock input terminal receiving a train of clock pulses, said clock terminal being connected to a second input of all said flip-flops, and gating means connected to at least the n-th flip-flop pair serving to generate synchronously with one of said clock pulses exactly one output pulse for every input pulse received as long as the minimum time spacing between input pulses is substantially equal or greater than the spacing between the clock pulses.

4. Apparatus as in claim 3 together with additional gating means connected at least to the outputs of the n-th and (n−1)-th flip-flop pairs, said additional gating means serving to control the transmission of logic signals from the (n−1)-th to the n-th even numbered flip-flop.

5. Apparatus as in claim 4 wherein said additional gating means serves to prevent the transmission of said logic signals in case the following logic condition is true: $\bar{Q}_{n-1} \cdot Q_{n-1}' \cdot Q_n \cdot \bar{Q}_n' = 1$, wherein $Q_n = 1$ and $\bar{Q}_n' = 1$ mean that the n-th odd numbered flip-flop is set and the n-th even numbered flip-flop is reset respectively.

6. Apparatus as in claim 5 wherein said additional gating means also serves to prevent the transmission of said logic signal in case the following logic condition is true: $Q_{n-2}' \cdot Q_{n-1} \cdot Q_{n-1}' \cdot Q_n \cdot \bar{Q}_n' = 1$.

7. Apparatus as in claim 5 wherein said gating means and said additional gating means are implemented with AND and OR gates.

* * * * *